(12) United States Patent
Wang

(10) Patent No.: US 12,426,368 B2
(45) Date of Patent: Sep. 23, 2025

(54) DISPLAY PANEL, DISPLAY DEVICE, AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Yamin Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/758,982

(22) PCT Filed: Jul. 5, 2022

(86) PCT No.: PCT/CN2022/103790
§ 371 (c)(1),
(2) Date: Jul. 17, 2022

(87) PCT Pub. No.: WO2023/240715
PCT Pub. Date: Dec. 21, 2023

(65) Prior Publication Data
US 2024/0194687 A1    Jun. 13, 2024

(30) Foreign Application Priority Data
Jun. 15, 2022  (CN) .......................... 202210677833.6

(51) Int. Cl.
*H10D 86/60* (2025.01)
*H10D 86/01* (2025.01)
(Continued)

(52) U.S. Cl.
CPC .......... *H10D 86/60* (2025.01); *H10D 86/021* (2025.01); *H10D 86/441* (2025.01); *H10K 59/1213* (2023.02)

(58) Field of Classification Search
None
See application file for complete search history.

(56) References Cited

U.S. PATENT DOCUMENTS

2016/0307988 A1    10/2016    Kim et al.

FOREIGN PATENT DOCUMENTS

| CN | 102709326 A | 10/2012 |
| CN | 103904125 A | 7/2014 |

(Continued)

OTHER PUBLICATIONS

Machine-generated English translation of CN114284299 (Year: 2022).*

(Continued)

*Primary Examiner* — Bo B Jang
(74) *Attorney, Agent, or Firm* — PV IP PC; Wei Te Chung

(57) ABSTRACT

A display panel includes a substrate, a first semiconductor layer, a first metal layer, a second metal layer, a second semiconductor layer, and a third metal layer. The third metal layer includes a third gate electrode, and the third gate electrode overlaps the second semiconductor layer. One side of the third gate electrode adjacent to the second semiconductor layer is provided with a first oxygen-absorbing metal layer, and the first oxygen-absorbing metal layer overlaps the second semiconductor layer. The present disclosure can improve a display effect of the display panel.

20 Claims, 5 Drawing Sheets

(51) Int. Cl.
*H10D 86/40* (2025.01)
*H10K 59/121* (2023.01)

(56) References Cited

FOREIGN PATENT DOCUMENTS

| CN | 104916701 A | 9/2015 |
| CN | 112997335 A | 6/2021 |
| CN | 114284299 A | 4/2022 |
| CN | 114420763 A | 4/2022 |
| WO | 2022043826 A1 | 3/2022 |

OTHER PUBLICATIONS

Machine-generated English translation of CN114420763 (Year: 2022).*
Machine-generated English translation of CN103904125 (Year: 2014).*
International Search Report in International application No. PCT/CN2022/103790, mailed on Nov. 25, 2022.
Written Opinion of the International Search Authority in International application No. PCT/CN2022/103790, mailed on Nov. 25, 2022.
Chinese Office Action issued in corresponding Chinese Patent Application No. 202210677833.6 dated Oct. 17, 2024, pp. 1-6.

* cited by examiner

DISPLAY PANEL, DISPLAY DEVICE, AND MANUFACTURING METHOD THEREOF

FIELD OF INVENTION

The present disclosure relates to the field of display technologies, and more particularly, to a display panel, a display device, and a manufacturing method thereof.

BACKGROUND OF INVENTION

IGZO is the abbreviation of indium gallium zinc oxide. IGZO thin film transistors using indium gallium zinc oxide as a semiconductor channel layer material have advantages of high mobility, good uniformity, transparency, and simple processes. Liquid Crystal Displays (LCDs) and organic light-emitting diode (OLED) panels driven by IGZO-TFTs have many performance advantages, such as high precision, low power consumption, and high touch performances. Compared to conventional amorphous silicon (a-Si) thin film transistors (TFTs), IGZO-TFT devices perform better in field-effect mobility, switching current ratio, threshold voltage, and sub-threshold coefficient. Therefore, the IGZO-TFT devices are used as active layers of TFTs and widely used in active-matrix liquid crystal displays (AMLCDs) and active-matrix organic light-emitting diodes (AMOLEDs).

Technical problem: in display panels of the related art, IGZO will affect carrier concentrations due to non-bonded oxygens (NBOs for short), thereby affecting the threshold voltage and the switching current ratio and reducing the device stability of the thin film transistors, thereby affecting the display effect of the display panels.

SUMMARY OF INVENTION

An embodiment of the present disclosure provides a display panel, a display device, and a manufacturing method thereof to improve a display effect of the display panel.

In a first aspect, an embodiment of the present disclosure provides a display panel, which includes:
  a substrate;
  a first semiconductor layer disposed on one side of the substrate;
  a first metal layer disposed on one side of the first semiconductor layer away from the substrate, wherein, the first metal layer includes a first gate electrode, and the first gate electrode overlaps the first semiconductor layer;
  a second metal layer disposed on one side of the first metal layer away from the substrate, wherein, the second metal layer includes a second gate electrode;
  a second semiconductor layer disposed on one side of the second metal layer away from the substrate, wherein, the second semiconductor layer includes a metal oxide, and the second gate electrode overlaps the second semiconductor layer; and
  a third metal layer disposed on one side of the second semiconductor layer away from the substrate, wherein, the third metal layer includes a third gate electrode, and the third gate electrode overlaps the second semiconductor layer.

Wherein, one side of the third gate electrode adjacent to the second semiconductor layer is provided with a first oxygen-absorbing metal layer, and the first oxygen-absorbing metal layer overlaps the second semiconductor layer.

In a second aspect, an embodiment of the present disclosure provides a display device, which includes a controller and a display panel, wherein, the controller is electrically connected to the display panel;
  wherein the display panel includes:
  a substrate;
  a first semiconductor layer disposed on one side of the substrate;
  a first metal layer disposed on one side of the first semiconductor layer away from the substrate, wherein, the first metal layer includes a first gate electrode, and the first gate electrode overlaps the first semiconductor layer;
  a second metal layer disposed on one side of the first metal layer away from the substrate, wherein, the second metal layer includes a second gate electrode;
  a second semiconductor layer disposed on one side of the second metal layer away from the substrate, wherein, the second semiconductor layer includes a metal oxide, and the second gate electrode overlaps the second semiconductor layer; and
  a third metal layer disposed on one side of the second semiconductor layer away from the substrate, wherein, the third metal layer includes a third gate electrode, and the third gate electrode overlaps the second semiconductor layer.

Wherein, one side of the third gate electrode adjacent to the second semiconductor layer is provided with a first oxygen-absorbing metal layer, and the first oxygen-absorbing metal layer overlaps the second semiconductor layer.

In a third aspect, an embodiment of the present disclosure provides a manufacturing method of a display panel, which includes following steps:
  providing a substrate;
  disposing a first semiconductor layer on the substrate;
  disposing a first metal layer on the first semiconductor layer, wherein,
  the first metal layer includes a first gate electrode, and the first gate electrode overlaps the first semiconductor layer;
  disposing a second metal layer on the first metal layer, wherein, the second metal layer includes a second gate electrode;
  disposing a second semiconductor layer on the second metal layer, wherein, the second semiconductor layer includes a metal oxide, and the second gate electrode overlaps the second semiconductor layer; and
  disposing a third metal layer on the second semiconductor layer, wherein, the third metal layer includes a third gate electrode, and the third gate electrode overlaps the second semiconductor layer; and one side of the third gate electrode adjacent to the second semiconductor layer is provided with a first oxygen-absorbing metal layer, and the first oxygen-absorbing metal layer overlaps the second semiconductor layer.

Beneficial effect: in the display panel provided in the embodiments of the present disclosure, the first oxygen-absorbing metal layer is disposed on the side of the third gate electrode adjacent to the second semiconductor layer. By introducing the oxygen-absorbing metal, non-bonded oxygens (NBOs) in the second semiconductor layer or near the second semiconductor layer can be absorbed. Therefore, the influence of NBOs on carrier concentrations of the second semiconductor layer can be reduced, and the stability of the threshold voltage and the switching current ratio of thin film transistors in an array substrate can be improved. Thus, the device stability of the array substrate can be improved, thereby improving the display effect of the display panel.

10: substrate; 20: first semiconductor layer; 30: first gate electrode; 40: second gate electrode; 50: second semiconductor layer; 60: third gate electrode; 61: first oxygen-absorbing metal layer; 62: second oxygen-absorbing metal layer; 41: third oxygen-absorbing metal layer; and 42: fourth oxygen-absorbing metal layer.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

The embodiments of the present disclosure provide a display panel and a display device to improve a stability of a carrier concentration of a second semiconductor layer 50, thereby improving the stability of thin film transistors, and improving the display effect of the display panel. They will be described below with reference to the accompanying drawings.

Figure 1:
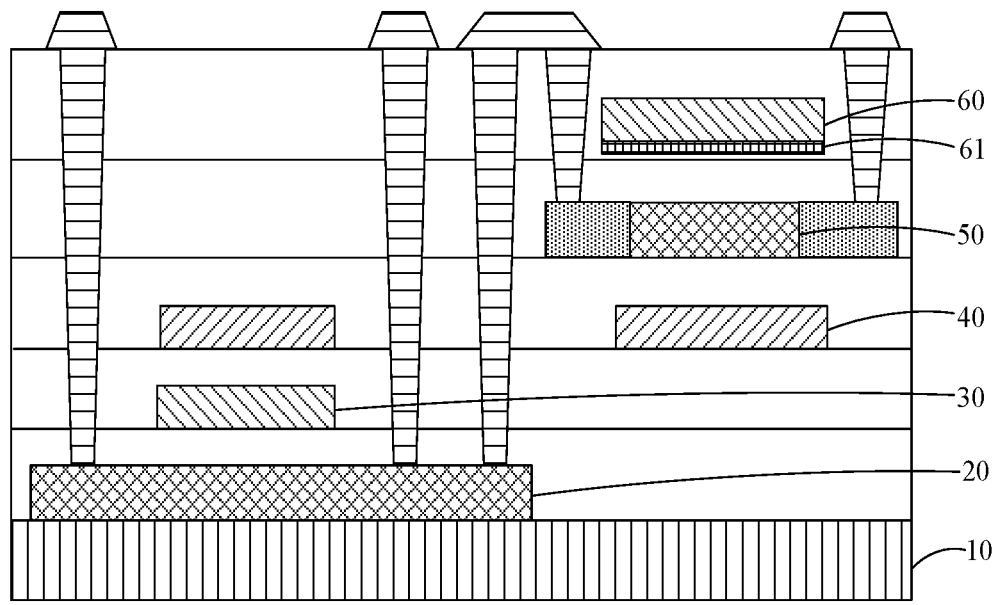
FIG. 1 is a schematic cross-sectional diagram of a display panel according to an embodiment of the present disclosure.

As an example, referring to FIG. 1, FIG. 1 is a schematic cross-sectional diagram of a display panel according to an embodiment of the present disclosure. The display panel includes: a substrate 10; a first semiconductor layer 20 disposed on one side of the substrate 10; a first metal layer disposed on one side of the first semiconductor 20 layer away from the substrate 10, wherein, the first metal layer includes a first gate electrode 30, and the first gate electrode 30 overlaps the first semiconductor layer 20; a second metal layer disposed on one side of the first metal layer away from the substrate 10, wherein, the second metal layer includes a second gate electrode 40; a second semiconductor layer 50 disposed on one side of the second metal layer away from the substrate 10, wherein, the second semiconductor layer 50 includes a metal oxide, and the second gate electrode 40 overlaps the second semiconductor layer 50; and a third metal layer disposed on one side of the second semiconductor layer 50 away from the substrate 10, wherein, the third metal layer includes a third gate electrode 60, and the third gate electrode 60 overlaps the second semiconductor layer 50. Wherein, one side of the third gate electrode 60 adjacent to the second semiconductor layer 50 is provided with a first oxygen-absorbing metal layer 61, and the first oxygen-absorbing metal layer 61 overlaps the second semiconductor layer 50.

In this embodiment, specifically, the display panel includes an array substrate, a color filter substrate, and a liquid crystal layer disposed between the array substrate and the color filter substrate. The array substrate is a main component of the display panel, which includes the substrate 10 and a display unit disposed on the substrate 10, and the display unit may include thin film transistors. The thin film transistors include the substrate 10, the first semiconductor layer 20, the first gate electrode 30, the second gate electrode 40, the second semiconductor layer 50, and the third gate electrode 60 mentioned above. Wherein, the first semiconductor layer 20 may be a low temperature polysilicon material, and the second semiconductor layer 50 may be a metal oxide material. A Low temperature polysilicon (LTPS) substrate refers to an array substrate having low temperature polysilicon thin film transistors as the thin film transistors in the display unit. An oxide substrate refers to an array substrate having oxide thin film transistors as the thin film transistors in the display unit.

Low temperature polysilicon active layers have a high mobility, thereby causing the low temperature polysilicon thin film transistors to have a large leakage current, and the low temperature polysilicon substrate has a large power consumption under driven of a low frequency, so that it is difficult to maintain static black images well, thereby causing poor image qualities. In addition, in order to better expand gray scales, in the low temperature polysilicon substrate, it is necessary to make channels that drive the thin film transistors very long. This makes it difficult to achieve high resolution for the low temperature polysilicon substrate. The resolution refers to a number of pixels per inch. In addition, the low temperature polysilicon active layers have large hysteresis, so the low temperature polysilicon substrate is prone to have a problem of afterimage. Oxide active layers have a low mobility, thereby causing the oxide thin film transistors to have a small leakage current, and the oxide substrate has a small power consumption under driven of the low frequency, so that it can maintain the static black images well, thereby improving image qualities. In addition, the oxide active layers have less hysteresis, so the oxide substrate is not prone to have afterimage. Further, the uniformity of the oxide thin film transistors is better than that of the low temperature polysilicon thin film transistors.

From the above description, it can be seen that the oxide thin film transistors can well make up for some deficiencies of the low temperature polysilicon thin film transistors, but both have their own advantages and disadvantages. Therefore, the combination of the oxide thin film transistors and the low temperature polysilicon thin film transistors can obtain the low temperature polycrystalline oxide (LTPO) technique.

The substrate 10 is used as a supporting structure in the array substrate to support other film structures on the array substrate, thereby maintaining relative stability of the array substrate. Wherein, the substrate 10 may be a glass substrate, a hard substrate of other materials, or a flexible substrate, which is not limited herein.

The display panel includes the thin film transistor layer mentioned above. The thin film transistors are disposed on the substrate 10 as switch control structures of the array substrate, which are used to control other functional layer structures disposed on the array substrate to satisfy different application requirements.

Wherein, the thin film transistor layer includes a first thin film transistor, and the first thin film transistor includes the first semiconductor layer 20, the first gate electrode 30, and a first source and drain electrode layer. The first source and drain electrode layer is disposed on one side of the first gate electrode 30 away from the first semiconductor layer 20. The first source and drain electrode layer includes a first source electrode and a first drain electrode electrically connected to the first semiconductor layer 20. By electrically connecting the first source electrode and the first drain electrode to the first semiconductor layer 20 and controlling a driving voltage of the first source electrode and the first drain electrode, conduction and disconnection of the first semiconductor layer 20 connected between the first source electrode and the first drain electrode can be realized, thereby controlling other functional layer structures disposed on the array substrate. The first gate electrode 30 is used as a switch structure of the first thin film transistor, and the first thin film transistor can be turned on or off by adjusting a driving voltage of an input terminal of the first gate electrode 30, so that the first thin film transistor can control other functional structures.

The thin film transistor layer further includes a second thin film transistor, and the second thin film transistor includes the second gate electrode 40, the second semiconductor layer 50, the third gate electrode 60, and a second source and drain electrode layer. The second source and drain electrode layer is disposed on one side of the third gate electrode 60 away from the second semiconductor layer 50, and the second source and drain electrode layer includes a second source electrode and a second drain electrode electrically connected to the second semiconductor layer 50.

It can be understood that the first semiconductor layer 20, and the first gate electrode 30 and the first source and drain electrode layer sequentially disposed on the first semiconductor layer 20 together constitute the first thin film transistor, which is a single gate type. The second semiconductor layer 50, the second gate electrode 40 and the third gate electrode 60 disposed on both sides of the second semiconductor layer 50, and the second source and drain electrode layer together constitute the second thin film transistor, which is a double gate type. When the array substrate is used in an active-matrix organic light-emitting diode display panel, the first thin film transistor may act as a switching thin film transistor for controlling the entry of data signals, and the second thin film transistor may act as a driving thin film transistor for controlling a current of organic light-emitting diodes. In this way, while realizing functions of the switching thin film transistor and the driving thin film transistor, since the second thin film transistor has a characteristic of reducing a voltage offset of entire second thin film transistor when different voltages are applied to the two gate electrodes, a voltage offset of the driving thin film transistor can be effectively reduced. Therefore, the brightness of the active-matrix organic light-emitting diode display panel can reach an expected value.

The second semiconductor layer 50 may be made of materials such as IGZO, IZTO, or IGZTO, and IGZO (indium gallium zinc oxide) is taken as an example. IGZO has a high mobility and can drive pixel electrodes integrated on the display panel with a fast speed and low power consumption. IGZO is easily affected by light and heat, and easily generates non-bonded oxygens (NBOs) after working for a long time. NBOs will form oxygen vacancies on the surface of IGZO, and the oxygen vacancies will catch carriers in channels of IGZO, thereby affecting carrier concentrations and causing a threshold voltage of the thin film transistors to shift.

The third gate electrode 60 is a metal material, which may be molybdenum, aluminum, copper, titanium, etc. A thickness of the third gate electrode 60 is set to range from 2000 Å to 4500 Å. Specifically, the first oxygen-absorbing metal layer 61 may be at least one of titanium, nickel, iron, zinc, or germanium. It may also be other metal material that can absorb the non-bonded oxygens. The first oxygen-absorbing metal layer 61 can absorb the non-bonded oxygens (NBOs) on IGZO to reduce formation of the oxygen vacancies on the surface of IGZO, thereby reducing the influence on the carriers in the channels. Therefore, the stability of the carrier concentrations can be ensured, thereby preventing the threshold voltage of the thin film transistors from shifting, so the display effect of the thin film transistors can be improved.

Specifically, the thickness of the first oxygen-absorbing metal layer 61 is set to range from 200 Å to 500 Å, such as 200 Å, 250 Å, 300 Å, 350 Å, 400 Å, 450 Å, 500 Å, etc. If the thickness of the first oxygen-absorbing metal layer 61 is less than 200 Å, an oxygen-absorbing effect to the second semiconductor layer 50 will be poorer, and it is hard to effectively improve the carrier concentrations of the second semiconductor layer 50. If the thickness of the first oxygen-absorbing metal layer 61 is greater than 500 Å, the overall thickness of the display panel will be affected. Therefore, the thickness of the first oxygen-absorbing metal layer 61 being set to range from 200 Å to 500 Å can improve the stability of the carrier concentrations of the second semiconductor layer 50 and can reasonably control the overall thickness of the display panel.

In practical applications, as shown in FIG. 1, an overlapping area between the first oxygen-absorbing metal layer 61 and the second semiconductor layer 50 is greater than or equal to an overlapping area between the third gate electrode 60 and the second semiconductor layer 50. Therefore, external light can be prevented from directly irradiating a channel region of the second semiconductor layer 50 (that is, the overlapping area between the third gate electrode 60 and the second semiconductor layer 50), thereby reducing the influence of the external light on the second semiconductor layer 50. Therefore, the carriers on the second semiconductor layer 50 can be prevented from energy level transitions, thereby ensuring the stability of the carrier concentrations.

In the display panel provided in the embodiment of the present disclosure, the first oxygen-absorbing metal layer 61 is disposed on the side of the third gate electrode 60 adjacent to the second semiconductor layer 50. By introducing the oxygen-absorbing metal, non-bonded oxygens (NBOs) in the second semiconductor layer 50 or near the second semiconductor layer 50 can be absorbed. Therefore, the influence of NBOs on the carrier concentrations of the second semiconductor layer 50 can be reduced, and the stability of the threshold voltage and the switching current ratio of the thin film transistors in the array substrate can be improved. Thus, the device stability of the array substrate can be improved, thereby improving the display effect of the display panel.

It should be noted that between every two adjacent structural layers such as the substrate 10, the first semiconductor layer, the first metal layer, the second metal layer, the second semiconductor layer 50, and the third metal layer, an insulating layer is used to realize insulation and buffering. The insulating layer is usually made of materials such as SiNx which has a high hydrogen content, and disposed on a whole surface, so that hydrogen ions in the insulating layer can easily intrude into IGZO which is extremely sensitive to hydrogen, thereby causing IGZO to be conductorized and to lose effectiveness. In order to solve this problem, in the embodiment of the present disclosure, a rate of material elongation of the first oxygen-absorbing metal layer 61 is set to range from 3% to 10%. For example, it may be 3%, 4%, 5%, 6%, 7%, 8%, 9%, or 10%. The rate of material elongation is a percentage of a ratio of a total deformation ΔL of a gauge length segment to an original gauge length L after tensile fracture of a material sample. If the rate of material elongation is higher, it indicates that a density of the oxygen-absorbing metal is larger, so that a blocking effect on the hydrogen ions will be better. Therefore, transfer of the hydrogen ions from the insulating layer to the second semiconductor layer 50 can be reduced, thereby reducing the influence on the carrier concentrations of the second semiconductor layer 50. That is to say, by selecting an oxygen-absorbing metal with a higher elongation rate, such as titanium metal, it can not only absorb the non-bonded oxygens of the second semiconductor layer 50, but also can reduce the transfer of the hydrogen ions to the second semiconductor layer 50. Therefore, the stability of the carrier concentrations of the second semiconductor layer 50 can be improved, thereby improving overall device stability of the thin film transistors. Wherein, if the rate of material elongation of the first oxygen-absorbing metal layer 61 is greater than 10%, the preparation of the first oxygen-absorbing metal layer 61 on the second semiconductor layer 50 will be more difficult. Therefore, the rate of material elongation of the first oxygen-absorbing metal layer 61 being set to range from 3% to 10% can also reduce overall processing difficulty of the thin film transistors.

Figure 2:
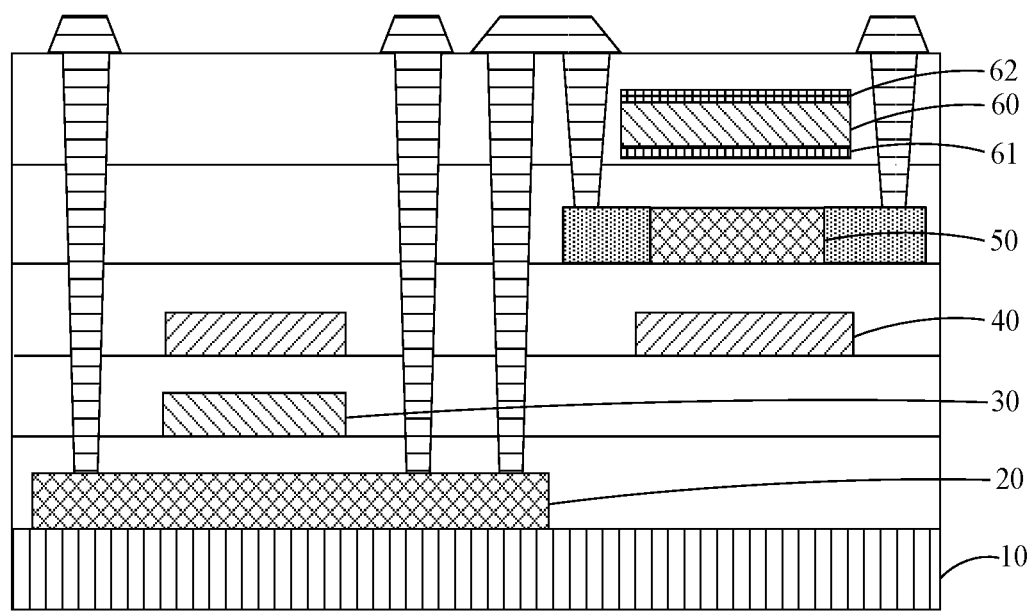
FIG. 2 is a schematic cross-sectional diagram of the display panel according to another embodiment of the present disclosure.

As an example, referring to FIG. 2, FIG. 2 is a schematic cross-sectional diagram of the display panel according to another embodiment of the present disclosure. One side of the third gate electrode 60 away from the second semiconductor layer 50 is provided with a second oxygen-absorbing metal layer 62, and the second oxygen-absorbing metal layer 62 overlaps the second semiconductor layer 50. Specifically, the second oxygen-absorbing metal layer 62 may be at least one of titanium, nickel, iron, zinc, or germanium. It may also be other metal material that can absorb the non-bonded oxygens. The second oxygen-absorbing metal layer 62 can also absorb the non-bonded oxygens (NBOs) near the second semiconductor layer 50 to reduce the formation of the oxygen vacancies on the surface of IGZO, thereby further reducing the influence on the carriers in the channels. Therefore, the stability of the carrier concentrations can be ensured, thereby preventing the threshold voltage of the thin film transistors from shifting, so the display effect of the thin film transistors can be improved.

In addition, the second oxygen-absorbing metal layer 62 can further play a blocking effect on the second semiconductor layer 50, thereby reducing the influence of the external light on the second semiconductor layer 50. Therefore, the carriers on the second semiconductor layer 50 can be prevented from energy level transitions, thereby ensuring the stability of the carrier concentrations. In conjunction with the embodiments of the rate of elongation mentioned above, a rate of material elongation of the second oxygen-absorbing metal layer 62 may also be set to range from 3% to 10%. Therefore, the transfer of the hydrogen ions from the insulating layer to the second semiconductor layer 50 can be reduced, thereby reducing the influence on the carrier concentrations of the second semiconductor layer 50. Specifically, a thickness of the second oxygen-absorbing metal layer 62 is set to range from 200 Å to 500 Å, such as 200 Å, 250 Å, 300 Å, 350 Å, 400 Å, 450 Å, 500 Å, etc.

Figure 3:
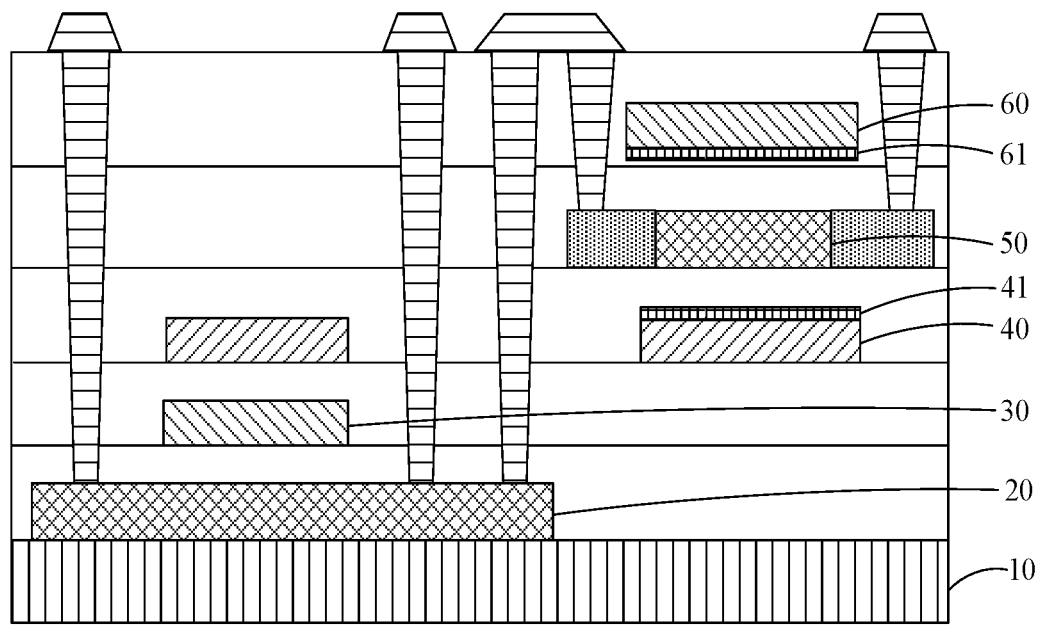
FIG. 3 is a schematic cross-sectional diagram of the display panel according to yet another embodiment of the present disclosure.

As an example, referring to FIG. 3, FIG. 3 is a schematic cross-sectional diagram of the display panel according to yet another embodiment of the present disclosure. One side of the second gate electrode 40 adjacent to the second semiconductor layer 50 is provided with a third oxygen-absorbing metal layer 41, and the third oxygen-absorbing metal layer 41 overlaps the second semiconductor layer 50. Specifically, the third oxygen-absorbing metal layer 41 may be at least one of titanium, nickel, iron, zinc, or germanium. It may also be other metal material that can absorb the non-bonded oxygens. The third oxygen-absorbing metal layer 41 can also absorb the non-bonded oxygens (NBOs) on the surface of the second semiconductor layer 50 to reduce the formation of the oxygen vacancies on the surface of IGZO, thereby further reducing the influence on the carriers in the channels. Therefore, the stability of the carrier concentrations can be ensured, thereby preventing the threshold voltage of the thin film transistors from shifting, so the display effect of the thin film transistors can be improved.

In conjunction with the embodiments of the rate of elongation mentioned above, a rate of material elongation of the third oxygen-absorbing metal layer 41 may also be set to range from 3% to 10%. Therefore, the transfer of the hydrogen ions from the insulating layer to the second semiconductor layer 50 can be reduced, thereby reducing the influence on the carrier concentrations of the second semiconductor layer 50. Specifically, a thickness of the third oxygen-absorbing metal layer 41 is set to range from 200 Å to 500 Å, such as 200 Å, 250 Å, 300 Å, 350 Å, 400 Å, 450 Å, 500 Å, etc.

Figure 4:
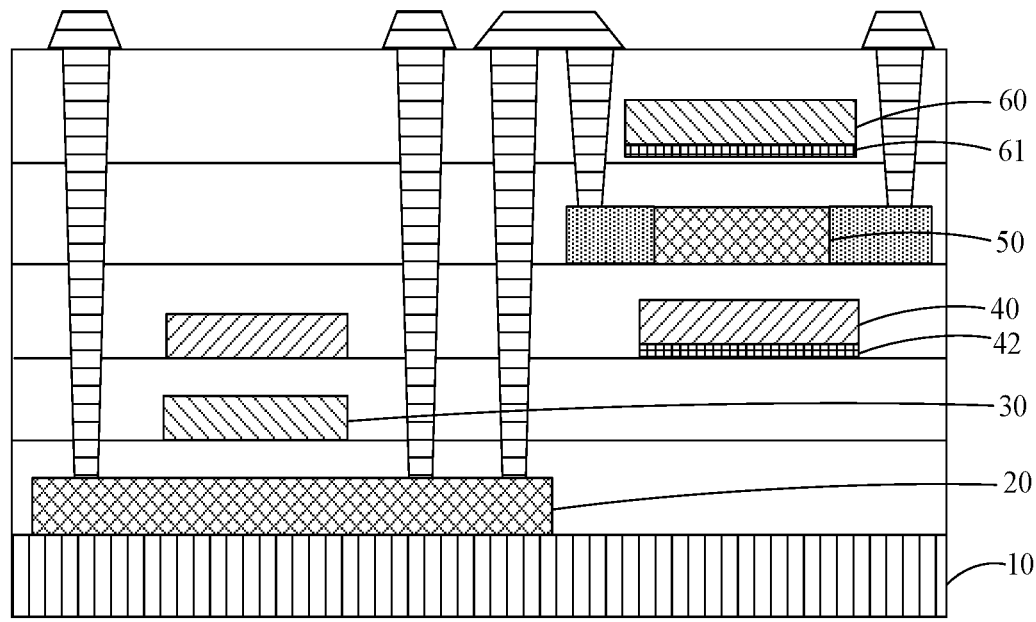
FIG. 4 is a schematic cross-sectional diagram of the display panel according to still another embodiment of the present disclosure.

As an example, referring to FIG. 4, FIG. 4 is a schematic cross-sectional diagram of the display panel according to still another embodiment of the present disclosure. One side of the second gate electrode 40 away from the second semiconductor layer 50 is provided with a fourth oxygen-absorbing metal layer 42, and the fourth oxygen-absorbing metal layer 42 overlaps the second semiconductor layer 50. Specifically, the fourth oxygen-absorbing metal layer 42 may be at least one of titanium, nickel, iron, zinc, or germanium. It may also be other metal material that can absorb the non-bonded oxygens. The fourth oxygen-absorbing metal layer 42 can also absorb the non-bonded oxygens (NBOs) near the second semiconductor layer 50 to reduce the formation of the oxygen vacancies on the surface of IGZO, thereby further reducing the influence on the carriers in the channels. Therefore, the stability of the carrier concentrations can be ensured, thereby preventing the threshold voltage of the thin film transistors from shifting, so the display effect of the thin film transistors can be improved.

In conjunction with the embodiments of the rate of elongation mentioned above, a rate of material elongation of the fourth oxygen-absorbing metal layer 42 may also be set to range from 3% to 10%. Therefore, the transfer of the hydrogen ions from the insulating layer to the second semiconductor layer 50 can be reduced, thereby reducing the influence on the carrier concentrations of the second semiconductor layer 50. Specifically, a thickness of the fourth oxygen-absorbing metal layer 42 is set to range from 200 Å to 500 Å, such as 200 Å, 250 Å, 300 Å, 350 Å, 400 Å, 450 Å, 500 Å, etc.

As an example, the second gate electrode 40 may be an alloy layer mixed with an oxygen-absorbing metal, and specifically, may be a molybdenum-titanium alloy. As such, similarly, the second gate electrode 40 can also have the oxygen-absorbing effect and can absorb the non-bonded oxygens (NBOs) near the second semiconductor layer 50 to reduce the formation of the oxygen vacancies on the surface of IGZO, thereby further reducing the influence on the carriers in the channels. Therefore, the stability of the carrier concentrations can be ensured, thereby preventing the threshold voltage of the thin film transistors from shifting, so the display effect of the thin film transistors can be improved.

Specifically, a mass percentage of the oxygen-absorbing metal in the second gate electrode 40 may be set to range from 20 wt % to 80 wt %, for example, it may be 20 wt %, 30 wt %, 40 wt %, 50 wt %, 60 wt %, 70 wt %, or 80 wt %. If the mass percentage of the oxygen-absorbing metal in the second gate electrode 40 is less than 20 wt %, an absorbing effect to the NBOs will be poorer, thereby being unable to effectively ensure the stability of the carrier concentrations of IGZO. In practical applications, molybdenum metal can stably play a switch control function of the second gate electrode 40, and the mass percentage of the oxygen-absorbing metal in the second gate electrode 40 needs to be less than that of the molybdenum metal, thereby allowing the second gate electrode 40 to have a sufficient content of the molybdenum metal, thereby ensuring the function of the second gate electrode 40. Therefore, the mass percentage of the oxygen-absorbing metal in the second gate electrode 40 can be further limited to range from 20 wt % to 40 wt %.

Figure 5:
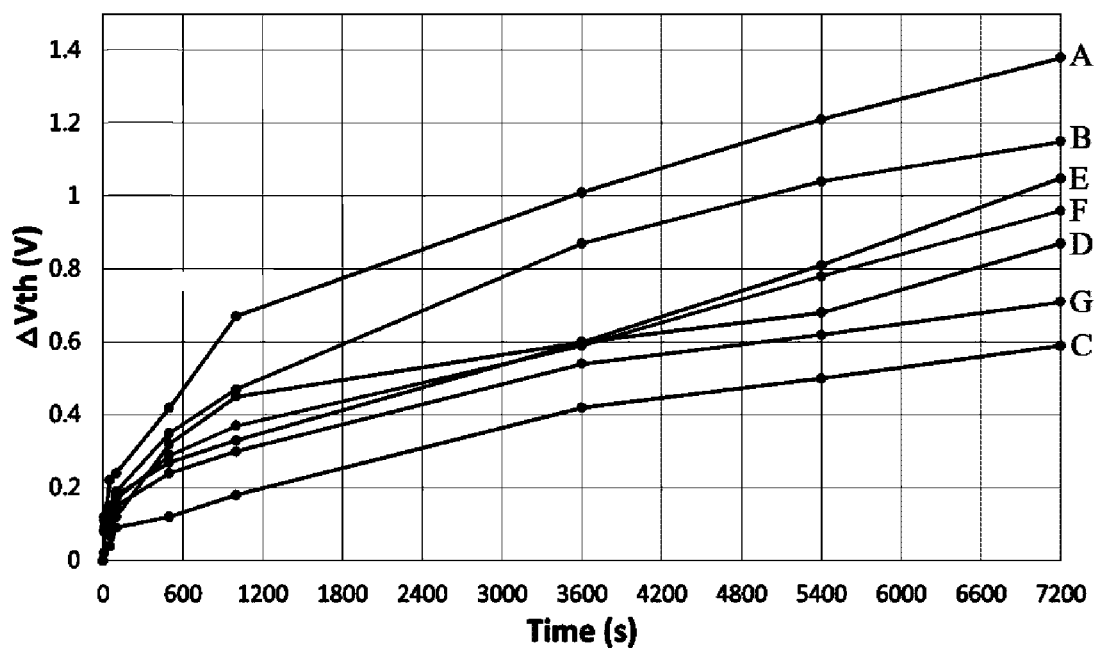
FIG. 5 is a graph of a relationship between threshold voltage offset changes and time of the display panel according to an embodiment of the present disclosure.

In order to further verify the effect of introducing the oxygen-absorbing metal into the gate electrode layer, referring to FIG. 5, FIG. 5 is a graph of a relationship between threshold voltage offset changes and time of the thin film transistors according to an embodiment of the present disclosure. Specifically, A forward voltage of +30V is applied to the second gate electrode 40 of the array substrate, and the voltage is extracted at time nodes of t=0 s, 10, 50 s, 100 s, 500 s, 1000 s, 3600 s, 5400 s, and 7200 s, respectively, to confirm the voltage curve is positive shift. An average value of 10 to 20 threshold voltage points is obtained and measured, thereby obtaining the graph of the relationship between the threshold voltage offset changes and time. Taking the oxygen-absorbing metal being titanium as an example, if the third gate electrode 60 is molybdenum and the first oxygen-absorbing metal layer 61 is titanium, then a threshold voltage offset change thereof corresponds to curve A in FIG. 5. From the curve A, it can be seen that by disposing the first oxygen-absorbing metal layer 61, the offset of the threshold voltage of the array substrate can be effectively reduced.

If the first oxygen-absorbing metal layer 61 and the second oxygen-absorbing metal layer 62 are respectively provided on both sides of the third gate electrode 60, then a threshold voltage offset change thereof corresponds to curve B in FIG. 5. From the curve B, it can be seen that using a structure of first oxygen-absorbing metal layer 61/third gate electrode 60/second oxygen-absorbing metal layer 62 can effectively reduce the offset of the threshold voltage of the array substrate.

If the side of the second gate electrode 40 facing the second semiconductor layer 50 is provided with the third oxygen-absorbing metal layer 41, then a threshold voltage offset change thereof corresponds to curve C in FIG. 5. From the curve C, it can be seen that disposing the third oxygen-absorbing metal layer 41 on the side of the second gate electrode 40 facing the second semiconductor layer 50 can effectively reduce the offset of the threshold voltage.

If the side of the second gate electrode 40 facing the second semiconductor layer 50 is provided with the third oxygen-absorbing metal layer 41, and the side of the second gate electrode 40 away from the second semiconductor layer 50 is provided with the fourth oxygen-absorbing metal layer 42, then a threshold voltage offset change thereof corresponds to curve D in FIG. 5. From the curve D, it can be seen that disposing the third oxygen-absorbing metal layer 41 on the side of the second gate electrode 40 facing the second semiconductor layer 50 and disposing the fourth oxygen-absorbing metal layer 42 on the side of the second gate electrode 40 away from the second semiconductor layer 50 can effectively reduce the offset of the threshold voltage.

If the second gate electrode 40 is the alloy layer mixed with the oxygen-absorbing metal, and the first oxygen-absorbing metal layer 61 and the second oxygen-absorbing metal layer 62 are respectively provided on both sides of the third gate electrode 60, then a threshold voltage offset change thereof corresponds to curve E in FIG. 5. From the curve E, it can be seen that when the second gate electrode 40 is the alloy layer mixed with the oxygen-absorbing metal, the offset of the threshold voltage of the array substrate can be effectively reduced.

If the side of the second gate electrode 40 away from the second semiconductor layer 50 is provided with the fourth oxygen-absorbing metal layer 42, and the side of the third gate electrode 60 adjacent to the second semiconductor layer 50 is provided with the first oxygen-absorbing metal layer 61, then a threshold voltage offset change thereof corresponds to curve F in FIG. 5. From the curve F, it can be seen that disposing the fourth oxygen-absorbing metal layer 42 on the side of the second gate electrode 40 away from the second semiconductor layer 50 and disposing the first oxygen-absorbing metal layer 61 on the side of the third gate electrode 60 adjacent to the second semiconductor layer 50 can effectively reduce the offset of the threshold voltage.

If the second gate electrode 40 is the alloy layer mixed with the oxygen-absorbing metal, and the side of the third gate electrode 60 facing the second semiconductor layer 50 is provided with the first oxygen-absorbing metal layer 61, then a threshold voltage offset change thereof corresponds to curve G in FIG. 5. From the curve G, it can be seen that when the second gate electrode 40 is the alloy layer mixed with the oxygen-absorbing metal, and the side of the third gate electrode 60 facing the second semiconductor layer 50 is provided with the first oxygen-absorbing metal layer 61, the offset of the threshold voltage of the array substrate can be effectively reduced.

Figure 6:
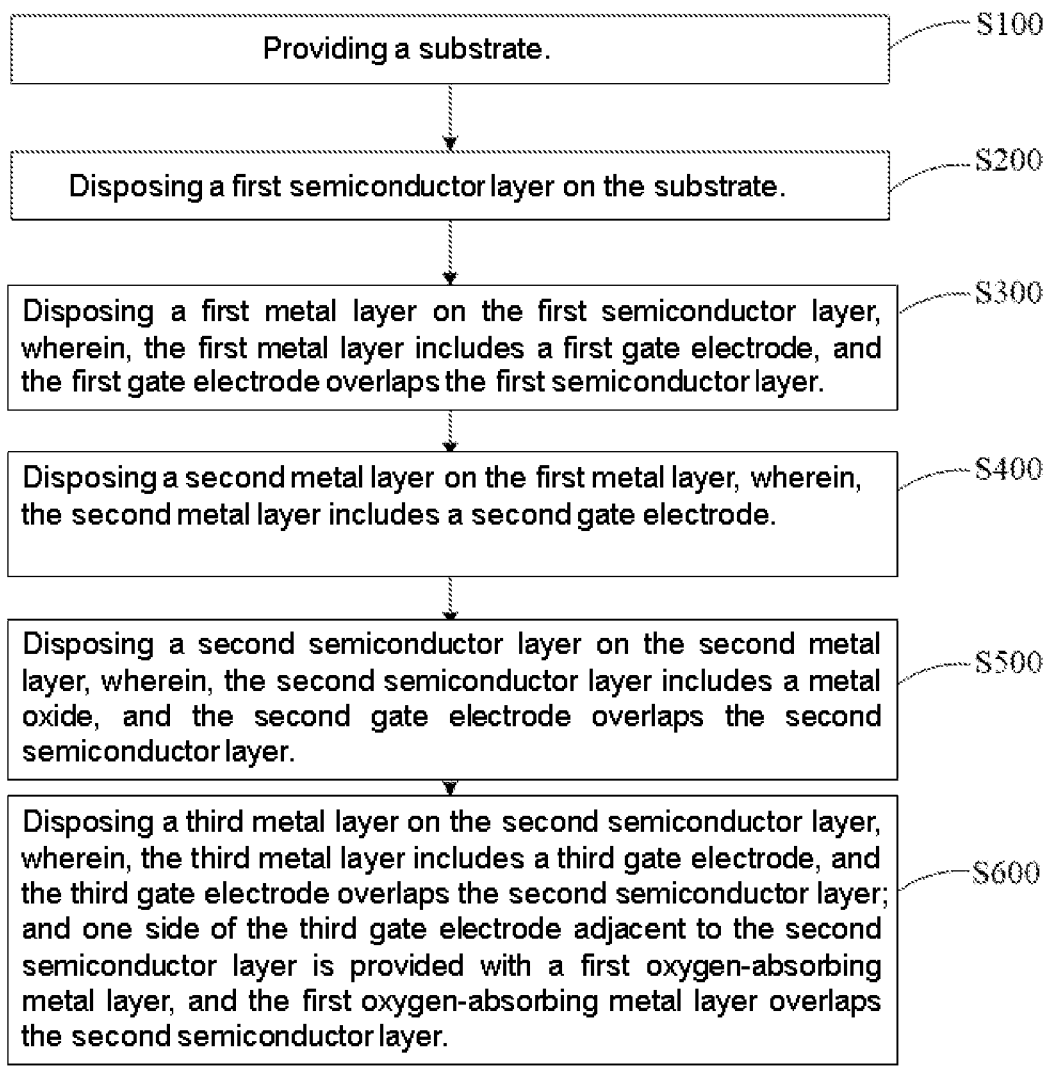
FIG. 6 is a flowchart of a manufacturing method of the display panel according to an embodiment of the present disclosure.

As an example, referring to FIG. 6, FIG. 6 is a flowchart of a manufacturing method of the display panel according to an embodiment of the present disclosure. An embodiment of the present disclosure further provides the manufacturing method of the display panel for manufacturing the display panel mentioned above. The manufacturing method of the display panel includes following steps.

S100: providing a substrate.

S200: disposing a first semiconductor layer on the substrate.

S300: disposing a first metal layer on the first semiconductor layer, wherein, the first metal layer includes a first gate electrode, and the first gate electrode overlaps the first semiconductor layer.

S400: disposing a second metal layer on the first metal layer, wherein, the second metal layer includes a second gate electrode.

S500: disposing a second semiconductor layer on the second metal layer, wherein, the second semiconductor layer includes a metal oxide, and the second gate electrode overlaps the second semiconductor layer.

S600: disposing a third metal layer on the second semiconductor layer, wherein, the third metal layer includes a third gate electrode, and the third gate electrode overlaps the second semiconductor layer; and one side of the third gate electrode adjacent to the second semiconductor layer is provided with a first oxygen-absorbing metal layer, and the first oxygen-absorbing metal layer overlaps the second semiconductor layer.

An embodiment of the present disclosure further provides a display device, which includes a controller and the display panel mentioned above, wherein, the controller is electrically connected to the display panel. The display device may be any product or component having a display function, such as an electronic paper, a mobile phone, a tablet computer, a television, a monitor, a notebook computer, a digital photo frame, a navigator, etc.

In the above embodiments, the description of each embodiment has its own emphasis. For the parts that are not described in detail in an embodiment, refer to the detailed description of other embodiments above.

In the description of the present disclosure, terms such as "first" and "second" are used herein for purposes of description and are not intended to indicate or imply relative importance or implicitly indicating the number of technical features indicated. Thus, features limited by "first" and "second" are intended to indicate or imply including one or more than one these features.

The manufacturing method of the thin film transistors provided by the embodiment of the present disclosure is described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising:
a substrate;
a first semiconductor layer disposed on one side of the substrate;
a first metal layer disposed on one side of the first semiconductor layer away from the substrate, wherein the first metal layer comprises a first gate electrode, and the first gate electrode overlaps the first semiconductor layer;
a second metal layer disposed on one side of the first metal layer away from the substrate, wherein the second metal layer comprises a second gate electrode;
a second semiconductor layer disposed on one side of the second metal layer away from the substrate, wherein the second semiconductor layer comprises a metal oxide, and the second gate electrode overlaps the second semiconductor layer; and
a third metal layer disposed on one side of the second semiconductor layer away from the substrate, wherein the third metal layer comprises a third gate electrode, and the third gate electrode overlaps the second semiconductor layer;
wherein one side of the third gate electrode adjacent to the second semiconductor layer is provided with a first oxygen-absorbing metal layer, and the first oxygen-absorbing metal layer overlaps the second semiconductor layer; the third gate electrode contacts the first oxygen-absorbing metal layer.

2. The display panel according to claim 1, wherein one side of the third gate electrode away from the second semiconductor layer is provided with a second oxygen-absorbing metal layer, and the second oxygen-absorbing metal layer overlaps the second semiconductor layer.

3. The display panel according to claim 1, wherein one side of the second gate electrode adjacent to the second semiconductor layer is provided with a third oxygen-absorbing metal layer, and the third oxygen-absorbing metal layer overlaps the second semiconductor layer.

4. The display panel according to claim 1, wherein one side of the second gate electrode away from the second semiconductor layer is provided with a fourth oxygen-absorbing metal layer, and the fourth oxygen-absorbing metal layer overlaps the second semiconductor layer.

5. The display panel according to claim 1, wherein the second gate electrode is an alloy layer mixed with an oxygen-absorbing metal.

6. The display panel according to claim 1, wherein an overlapping area between the first oxygen-absorbing metal layer and the second semiconductor layer is greater than or equal to an overlapping area between the third gate electrode and the second semiconductor layer.

7. The display panel according to claim 1, wherein the first oxygen-absorbing metal layer comprises at least one of titanium, nickel, iron, zinc, or germanium.

8. The display panel according to claim 1, wherein a rate of material elongation of the first oxygen-absorbing metal layer ranges from 3% to 10%.

9. The display panel according to claim 1, wherein a thickness of the first oxygen-absorbing metal layer ranges from 200 Å to 500 Å; and a thickness of the third gate electrode ranges from 2000 Å to 4500 Å.

10. A display device, comprising a controller and a display panel, wherein the controller is electrically connected to the display panel;
wherein the display panel comprises:
a substrate;
a first semiconductor layer disposed on one side of the substrate;
a first metal layer disposed on one side of the first semiconductor layer away from the substrate, wherein the first metal layer comprises a first gate electrode, and the first gate electrode overlaps the first semiconductor layer;
a second metal layer disposed on one side of the first metal layer away from the substrate, wherein the second metal layer comprises a second gate electrode;
a second semiconductor layer disposed on one side of the second metal layer away from the substrate, wherein the second semiconductor layer comprises a metal oxide, and the second gate electrode overlaps the second semiconductor layer; and
a third metal layer disposed on one side of the second semiconductor layer away from the substrate, wherein the third metal layer comprises a third gate electrode, and the third gate electrode overlaps the second semiconductor layer;
wherein one side of the third gate electrode adjacent to the second semiconductor layer is provided with a first oxygen-absorbing metal layer, and the first oxygen-absorbing metal layer overlaps the second semiconductor layer; the third gate electrode contacts the first oxygen-absorbing metal layer.

11. The display device according to claim 10, wherein one side of the third gate electrode away from the second semiconductor layer is provided with a second oxygen-absorbing metal layer, and the second oxygen-absorbing metal layer overlaps the second semiconductor layer.

12. The display device according to claim 10, wherein one side of the second gate electrode adjacent to the second semiconductor layer is provided with a third oxygen-absorbing metal layer, and the third oxygen-absorbing metal layer overlaps the second semiconductor layer.

13. The display device according to claim 10, wherein one side of the second gate electrode away from the second semiconductor layer is provided with a fourth oxygen-absorbing metal layer, and the fourth oxygen-absorbing metal layer overlaps the second semiconductor layer.

14. The display device according to claim 10, wherein the second gate electrode is an alloy layer mixed with an oxygen-absorbing metal.

15. The display device according to claim 10, wherein an overlapping area between the first oxygen-absorbing metal layer and the second semiconductor layer is greater than or equal to an overlapping area between the third gate electrode and the second semiconductor layer.

16. The display device according to claim 10, wherein the first oxygen-absorbing metal layer comprises at least one of titanium, nickel, iron, zinc, or germanium.

17. The display device according to claim 10, wherein a rate of material elongation of the first oxygen-absorbing metal layer ranges from 3% to 10%.

18. The display device according to claim 10, wherein a thickness of the first oxygen-absorbing metal layer ranges from 200 Å to 500 Å; and a thickness of the third gate electrode ranges from 2000 Å to 4500 Å.

19. A manufacturing method of a display panel, comprising following steps:
   providing a substrate;
   disposing a first semiconductor layer on the substrate;
   disposing a first metal layer on the first semiconductor layer, wherein the first metal layer comprises a first gate electrode, and the first gate electrode overlaps the first semiconductor layer;
   disposing a second metal layer on the first metal layer, wherein the second metal layer comprises a second gate electrode;
   disposing a second semiconductor layer on the second metal layer, wherein the second semiconductor layer comprises a metal oxide, and the second gate electrode overlaps the second semiconductor layer; and
   disposing a third metal layer on the second semiconductor layer, wherein the third metal layer comprises a third gate electrode, and the third gate electrode overlaps the second semiconductor layer; and one side of the third gate electrode adjacent to the second semiconductor layer is provided with a first oxygen-absorbing metal layer, and the first oxygen-absorbing metal layer overlaps the second semiconductor layer.

20. The manufacturing method of the display panel according to claim 19, wherein the substrate is a glass substrate.

* * * * *